(12) United States Patent
Kikuchi et al.

(10) Patent No.: US 8,334,730 B2
(45) Date of Patent: Dec. 18, 2012

(54) CONNECTION METHOD AND SUBSTRATE

(75) Inventors: Masato Kikuchi, Tokyo (JP); Shunsuke Mochizuki, Tokyo (JP); Masahiro Yoshioka, Tokyo (JP); Ryosuke Araki, Tokyo (JP); Masaki Handa, Kanagawa (JP); Takashi Nakanishi, Tokyo (JP); Hiroshi Ichiki, Kanagawa (JP); Tetsujiro Kondo, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/431,698

(22) Filed: Mar. 27, 2012

(65) Prior Publication Data

US 2012/0182083 A1 Jul. 19, 2012

Related U.S. Application Data

(62) Division of application No. 12/474,531, filed on May 29, 2009.

(30) Foreign Application Priority Data

Jun. 13, 2008 (JP) ................ P2008-156048
Aug. 22, 2008 (JP) ................ P2008-214553

(51) Int. Cl.
*H03H 7/38* (2006.01)
(52) U.S. Cl. .......................................... 333/34
(58) Field of Classification Search .............. 333/33, 333/34, 238, 246, 247
See application file for complete search history.

(56) References Cited

U.S. PATENT DOCUMENTS

| | | | |
|---|---|---|---|
| 5,184,095 A | 2/1993 | Hanz et al. | |
| 6,331,806 B1 | 12/2001 | Shingyoji et al. | |
| 6,639,487 B1 * | 10/2003 | Salmela et al. | 333/34 |
| 6,737,931 B2 | 5/2004 | Amparan et al. | |

FOREIGN PATENT DOCUMENTS

| | | |
|---|---|---|
| JP | 6-15310 | 2/1994 |
| JP | 2000-216510 | 8/2000 |

* cited by examiner

*Primary Examiner* — Stephen Jones
(74) *Attorney, Agent, or Firm* — Oblon, Spivak, McClelland, Maier & Neustadt, L.L.P.

(57) ABSTRACT

A connection method includes the step of connecting, using a line on a dielectric element, two points through which a signal flows, the two points having different heights and the widths of the line at the positions of the two points having been adjusted on the basis of the thickness of the dielectric element.

6 Claims, 28 Drawing Sheets

FIG. 11

| DIELECTRIC CONSTANT | CONDUCTOR WIDTH/ SUBSTRATE THICKNESS (W/d) | EFFECTIVE DIELECTRIC CONSTANT | CHARACTERISTIC IMPEDANCE | DIELECTRIC CONSTANT | CONDUCTOR WIDTH/ SUBSTRATE THICKNESS (W/d) | EFFECTIVE DIELECTRIC CONSTANT | CHARACTERISTIC IMPEDANCE | DIELECTRIC CONSTANT | CONDUCTOR WIDTH/ SUBSTRATE THICKNESS (W/d) | EFFECTIVE DIELECTRIC CONSTANT | CHARACTERISTIC IMPEDANCE |
|---|---|---|---|---|---|---|---|---|---|---|---|
| 4.80 | 0.5 | 3.28 | 92.1 | 4.00 | 0.5 | 2.80 | 99.7 | 2.55 | 0.5 | 1.93 | 120.1 |
| 4.80 | 1.0 | 3.43 | 68.1 | 4.00 | 1.0 | 2.92 | 73.9 | 2.55 | 1.0 | 1.99 | 89.4 |
| 4.80 | 1.5 | 3.53 | 55.5 | 4.00 | 1.5 | 3.00 | 60.2 | 2.55 | 1.5 | 2.03 | 73.2 |
| 4.80 | 2.0 | 3.62 | 47.0 | 4.00 | 2.0 | 3.07 | 51.0 | 2.55 | 2.0 | 2.07 | 62.2 |
| 4.80 | 2.5 | 3.69 | 40.8 | 4.00 | 2.5 | 3.12 | 44.4 | 2.55 | 2.5 | 2.10 | 54.1 |
| 4.80 | 3.0 | 3.75 | 36.1 | 4.00 | 3.0 | 3.17 | 39.3 | 2.55 | 3.0 | 2.12 | 48.0 |
| 4.80 | 4.0 | 3.85 | 29.5 | 4.00 | 4.0 | 3.25 | 32.1 | 2.55 | 4.0 | 2.16 | 39.3 |

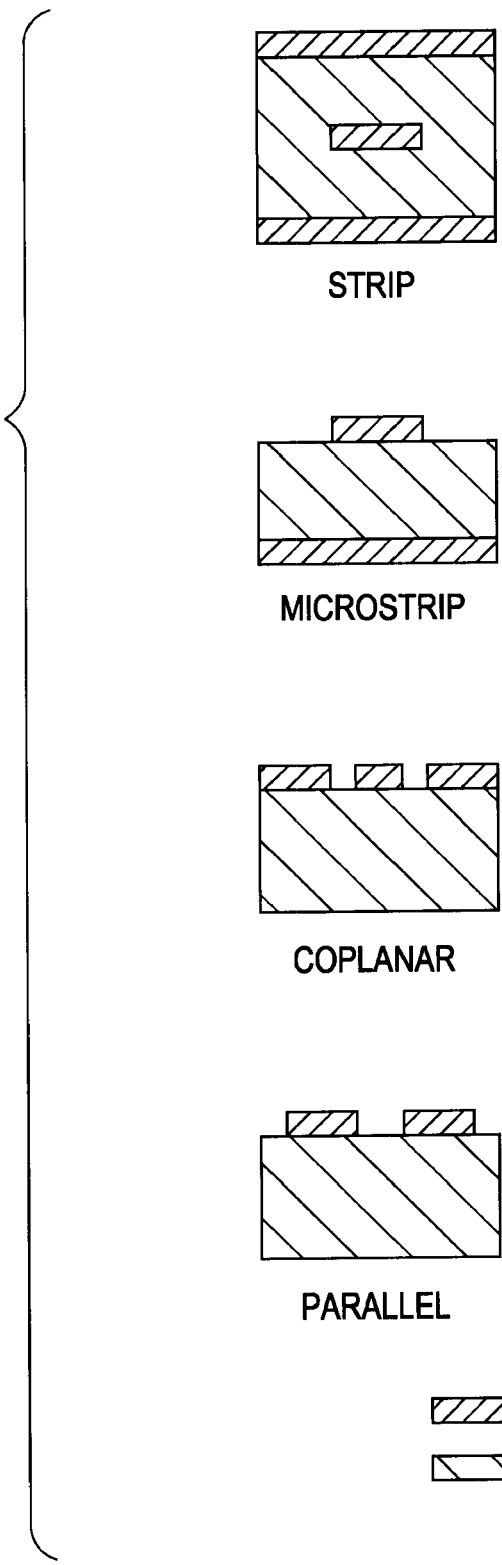

FILTER CIRCUIT

COUPLER CIRCUIT

MIXER CIRCUIT

SPLITTER CIRCUIT

FIG. 23

| CONDITIONS | SUBSTRATE A | SUBSTRATE B |
|---|---|---|
| SIGNAL LINE WIDTH | 3.2 mm | 3.2 mm |
| DIELECTRIC HEIGHT | 1.6 mm | 1.6 mm |
| CONDUCTOR HEIGHT | 0.2 mm | 0.2 mm |
| DIELECTRIC CONSTANT | 7.1 | 7.1 |
| DIELECTRIC LOSS(@10 GHz) | 0.005 | 0.005 |
| LINE LENGTH (A+B) | 30 mm ||
| BOUNDARY CONDITION | OPEN STRUCTURE IN WHICH MODEL OF BOUNDARY SURFACE CONTINUES TO INFINITY ||
| ANALYSIS METHOD | TIME DOMAIN ANALYSIS USING ELECTROMAGNETIC FIELD SIMULATOR TOOL ||

FIG. 25

| CONNECTION MODEL | S21 COMPONENTS | | |
|---|---|---|---|
| | @3 GHz | @6 GHz | @10 GHz |
| PRESENT INVENTION | −1.24 [dB] | −1.95 [dB] | −2.95 [dB] |
| THROUGH HOLE | −1.32 [dB] | −2.91 [dB] | −5.13 [dB] |
| WIRE BONDING | −2.91 [dB] | −5.89 [dB] | −9.26 [dB] |

RESULT OF TRANSMISSION SIGNAL DETERIORATION SIMULATION USING CONNECTION MODEL

CONNECTION METHOD AND SUBSTRATE

CROSS-REFERENCE TO RELATED APPLICATIONS

This application is a division of application Ser. No. 12/474,531, filed May 29, 2009 and claims the benefit of priority under 35 U.S.C. §119 from Japanese Patent Application No. JP2008-156048, filed Jun. 13, 2008 and Japanese Patent Application No. JP2008-214553, filed Aug. 22, 2008; the entire contents of each of which are incorporated herein by reference.

BACKGROUND OF THE INVENTION

1. Field of the Invention

The present invention relates to a connection method and a substrate. More particularly, the present invention relates to a connection method capable of reducing reflection due to impedance unmatching in a connection part and satisfactorily maintaining signal quality in a case where, for example, electronic parts are to be mounted on a substrate, and to a substrate for use therewith.

2. Description of the Related Art

Connection structures between parts and substrates are broadly divided into the following two types. One type is a completely shielded structure like a coaxial cable, and the other type is an open structure in which inductive capacity exists between signal lines like wiring on a substrate.

Although the latter open structure is inferior to a coaxial structure from the viewpoint of crosstalk and electromagnetic interference, it is a practical structure which is advantageous in terms of industrial cost incurred for design, manufacture, and inspection, and in terms of connection properties, as can be understood when compared with ordinary printed wiring substrates.

However, in the shape of lines of an open structure, when handling a high-speed signal, deterioration of a transmission signal becomes a significant problem. In particular, as shown in FIG. 1, in a connection part between an electronic part that is surface mounted on a substrate and a substrate, a transmission signal is likely to be attenuated/deteriorated due to the influence of a reflected wave caused by impedance unmatching.

By forming wiring to be a line structure like a microstrip, it is possible to adjust impedance so as to deal with a high-speed signal. However, in the case of mounting between layers/substrates/parts having different heights, it is necessary to extend a terminal portion from the part side as shown in FIG. 2, or it is necessary to form a viahole from a solder ball as shown in FIG. 3, thereby being connected to the wiring on the substrate. Therefore, in a connection part between a part and a substrate shown in FIG. 1, it is not possible to maintain a line structure through which impedance can be adjusted, and it is difficult to avoid deterioration of signal quality.

As a method of adjusting impedance in a connection part, a method disclosed in Japanese Unexamined Patent Application Publication No. 2000-216510 exists.

SUMMARY OF THE INVENTION

In the method disclosed in Japanese Unexamined Patent Application Publication No. 2000-216510, it is possible to reduce waveform distortion that is caused to occur in a transmission signal due to an inductance factor of a connector connected to a substrate. For that purpose, it is necessary to form a coaxial through hole in the periphery of a connection part.

As a consequence, for example, a structural arrangement problem makes it difficult to use this method for the end surface of a substrate, and a problem of space in high density wiring are likely to occur. Thus, it is difficult to cope with the recent technological trend toward higher wiring density and miniaturization of parts.

It is desirable to reduce reflection due to impedance unmatching in a connection part and to satisfactorily maintain signal quality in a case where, for example, electronic parts are to be mounted on a substrate on which a high-speed signal, such as a radio frequency (RF) signal is handled.

According to an embodiment of the present invention, there is provided a connection method including the step of connecting, using a line on a dielectric element, two points through which a signal flows, the two points having different heights and the widths of the line at the positions of the two points having been adjusted on the basis of the thickness of the dielectric element.

A higher point of the two points may be a point on a line of an electronic part mounted on a substrate, and a lower point of the two points may be a point on a line of the substrate.

An area along which the thickness of the dielectric element decreases toward a connection part with the line of the substrate may be formed in the end portion of the electronic part composed of a dielectric material, and the two points having different heights may be connected by a line disposed along the area.

Steps at which the thickness of the dielectric element decreases toward a connection part with a line of the substrate may be formed in the end portion of the electronic part composed of a dielectric material, and the two points having different heights may be connected by a line disposed on the steps.

According to another embodiment of the present invention, there is provided a substrate, wherein two points through which a signal flows, are connected using a line on a dielectric element, the two points having different heights and the widths of the line at the positions of the two points having been adjusted on the basis of the thickness of the dielectric element.

A higher point of the two points may be a point on a line of an electronic part mounted on a substrate, and a lower point of the two points may be a point on a line of the substrate.

An area along which the thickness of the dielectric element decreases toward a connection part with the line of the substrate may be formed in the end portion of the electronic part composed of a dielectric material, and the two points having different heights may be connected by a line disposed along the area.

Steps at which the thickness of the dielectric decreases toward a connection part with the line of the substrate may be formed in the end portion of the electronic part composed of a dielectric material, and the two points having different heights may be connected by a line disposed on the steps.

According to embodiments of the present invention, it is possible to reduce reflection due to impedance unmatching in a connection part and satisfactorily maintain signal quality in a case where, for example, electronic parts are to be mounted on a substrate.

BRIEF DESCRIPTION OF THE DRAWINGS

FIG. 11 shows results of calculations of characteristic impedance in a case where a microstrip line structure is adopted;

FIG. 12 shows examples of lines forming a connection part between a substrate and an electronic part;

FIG. 23 is another view showing conditions for a model;

FIG. 25 shows S21 components at each of frequencies 3 GHz, 6 GHz, and 10 GHz;

DESCRIPTION OF THE PREFERRED EMBODIMENTS

Figure 4:
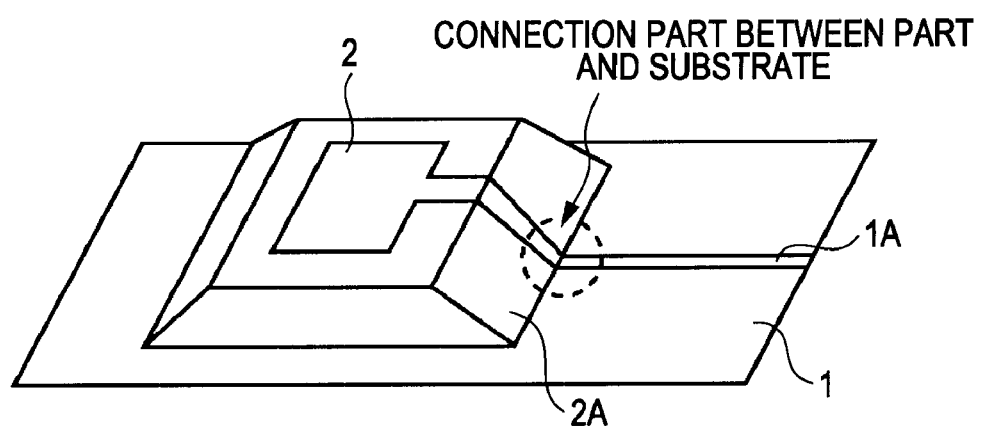
FIG. 4 shows an example of the configuration including a substrate and a surface mount part that is connected by a connection method according to an embodiment of the present invention.
Figure 5:
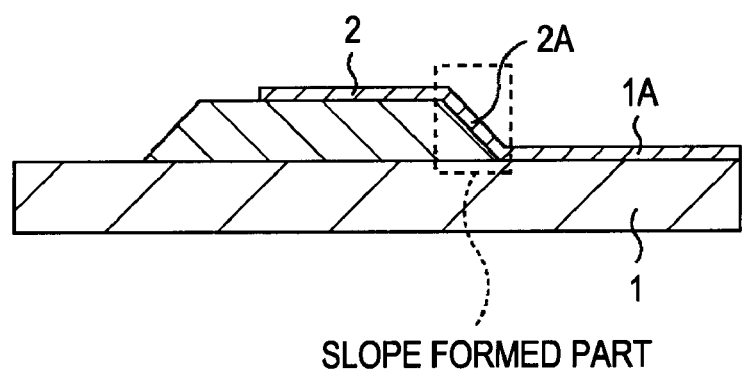
FIG. 5 is a sectional view of the structure shown in FIG. 4.
Figure 6:
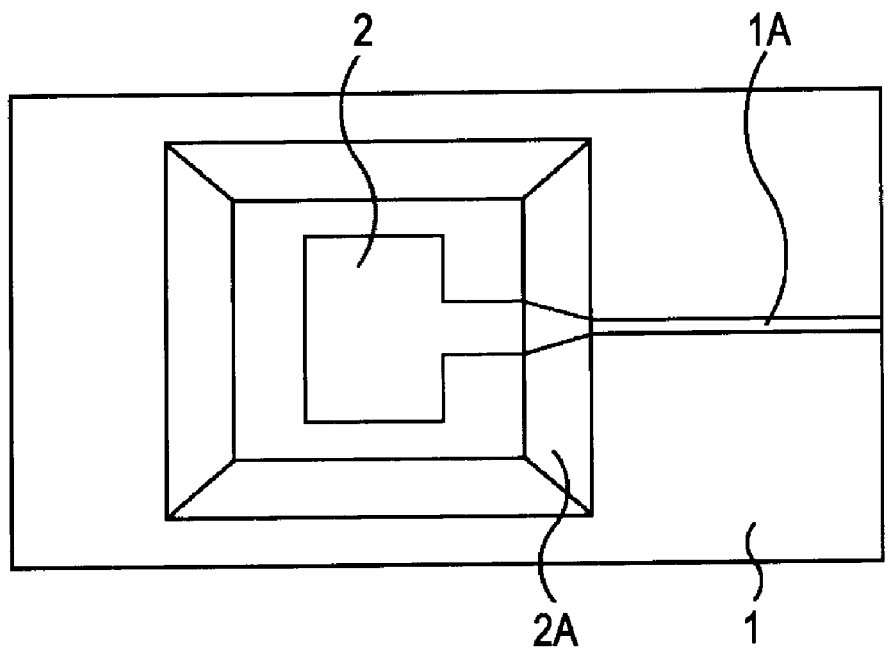
FIG. 6 is a view when the structure shown in FIG. 4 is viewed from directly above.

FIG. 4 is a perspective view showing an example of the configuration including a substrate 1 and a surface mount part 2, which are connected by a connection method according to an embodiment of the present invention. FIG. 5 is a sectional view showing the structure shown in FIG. 4. FIG. 6 is a front view when the structure shown in FIG. 4 is viewed from directly above.

Figure 1:
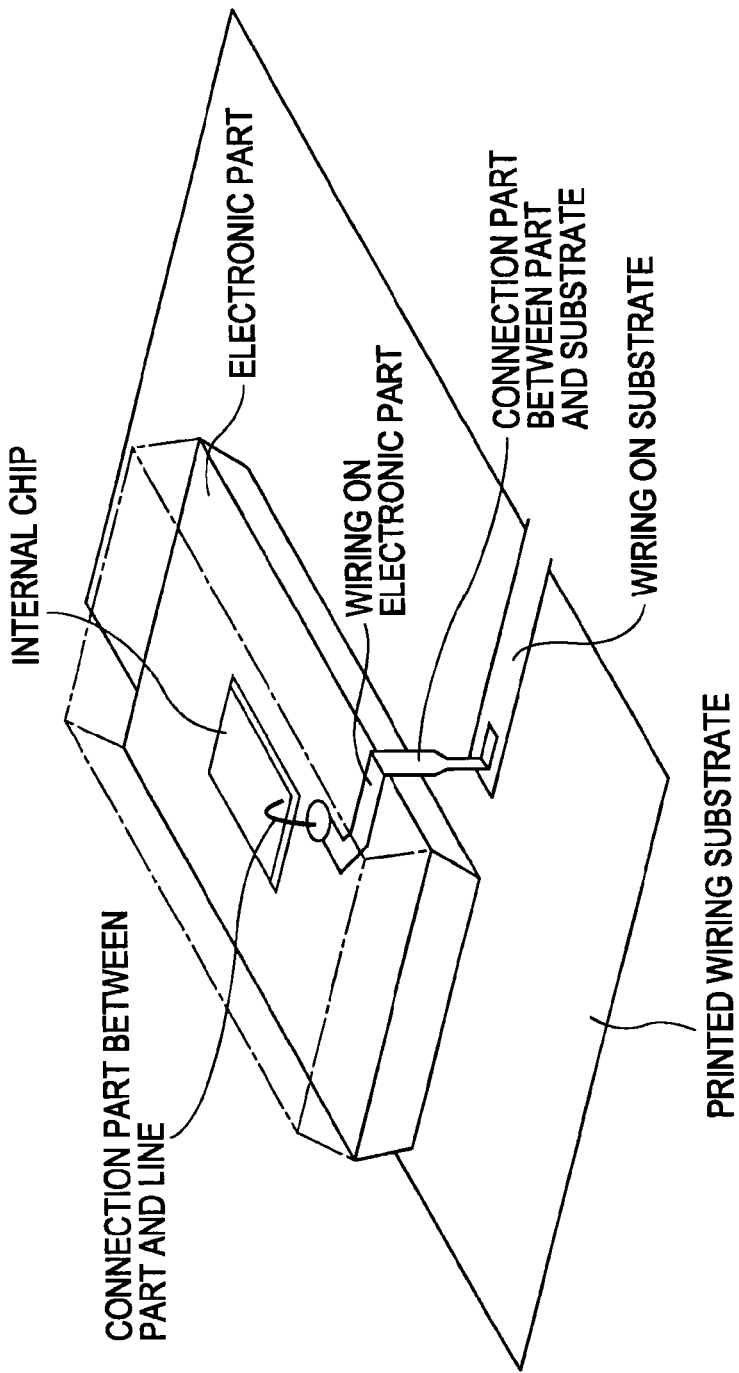
FIG. 1 shows a method for connecting an electronic part and a substrate according to the related art.
Figure 2:
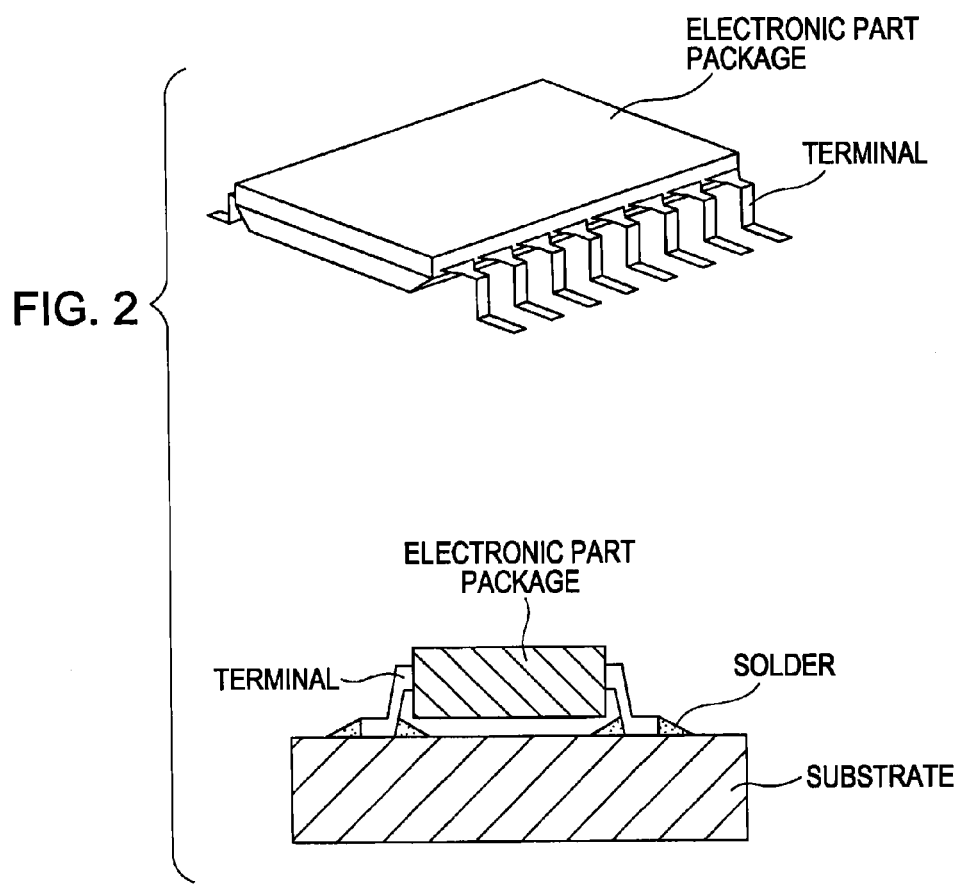
FIG. 2 shows the structure of a surface mount part according to the related art.

In general, in order to mount a part on a printed wiring substrate, a method in which a metal extension is connected to a device so as to make an electrical connection is adopted (see FIGS. 1 and 2). As is shown in such a manner as to be enclosed using a dotted line in FIG. 4, the connection part between the substrate 1 and the surface mount part 2, which are connected by this connection method, is formed in such a manner that a terminal end part that is extended as is kept to be a line shape from the top surface (the surface in parallel with the surface of the substrate 1) of the surface mount part 2 is connected to a line 1A disposed on the substrate 1.

The feature of this connection method lies in that, as shown in such a manner as to be enclosed using a dotted line of FIG. 5, by forming a dielectric end 2A of the surface mount part 2 so as to be a slope, the substrate 1 and the surface mount part 2 are connected to each other while a metal transmission line disposed in a dielectric element along the slope is made to gradually approach the substrate 1. In this example, the surface mount part 2 has a shape such that the cross section thereof in the vertical direction is a trapezoid.

At this time, the line width of a microstrip line on the side of the surface mount part 2 is adjusted by the characteristic impedance determined from electrical characteristics thereof and the geometric shape thereof. As shown in FIGS. 4 and 6, in this example, the nearer to the substrate 1, that is, the smaller the height of a position relative to the substrate 1 used as a reference and the smaller the thickness of the dielectric element of the slope on which the surface mount part 2 is mounted, the smaller the line width. In the example of FIGS. 4 and 6, the width in the connection part between the line disposed in the dielectric end 2A and the line 1A on the substrate 1 is the same as the width of the line 1A.

Figure 3:
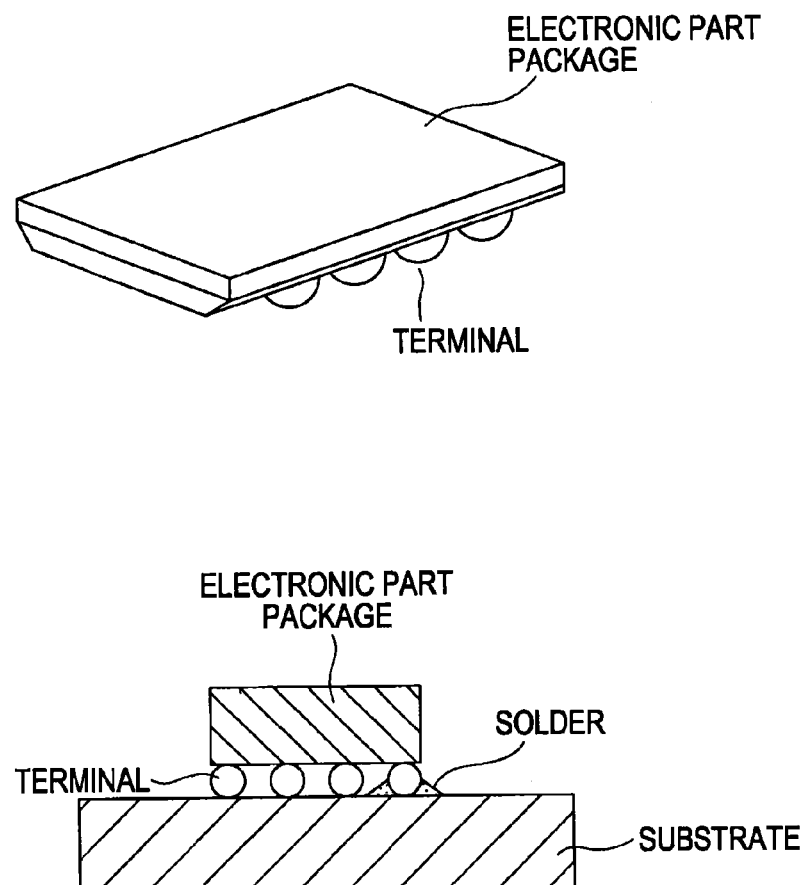
FIG. 3 shows another configuration of a surface mount part according to the related art.
Figure 7:
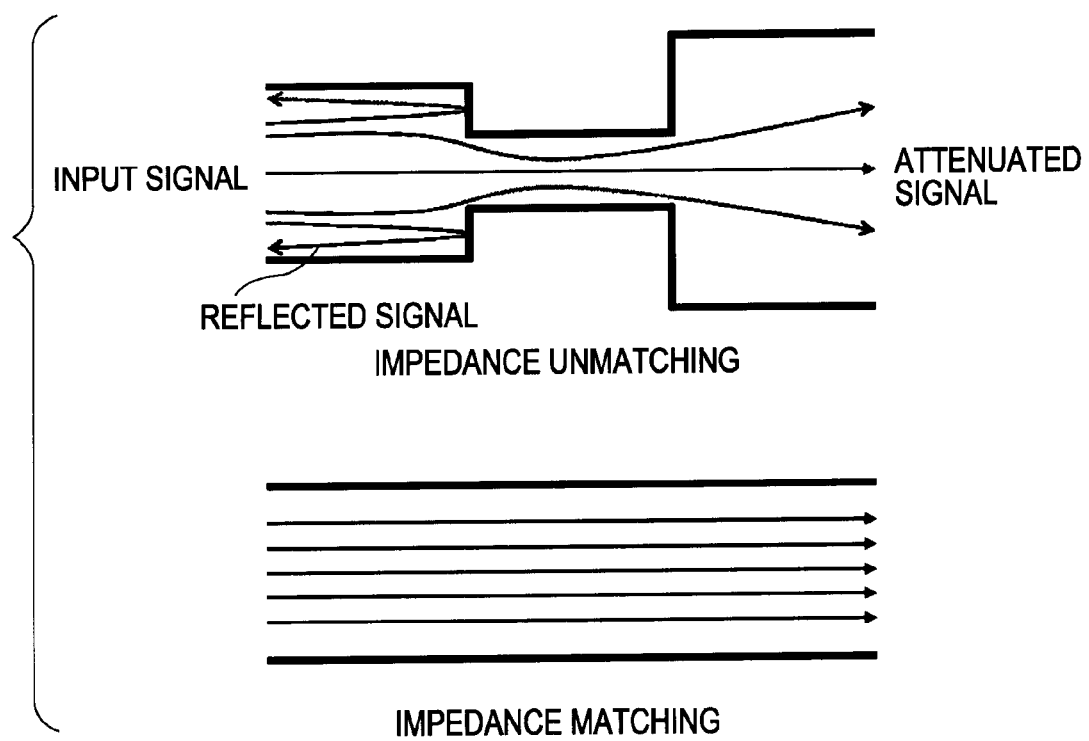
FIG. 7 shows an image in which discontinuous changes in impedance can be eliminated.

As described above, by gradually changing the line width and the dielectric thickness, it is possible to connect the substrate 1 to the surface mount part 2 while the characteristic impedance of the connection part is adjusted. Thus, it is possible to eliminate discontinuous changes of characteristic impedance in the connection part and reduce reflection components. An image of capable of eliminating discontinuous changes of characteristic impedance in the connection part and reducing reflection components is shown in FIG. 7. In the figure that shows an image of unmatching of characteristic impedance in the upper area of FIG. 7, the recessed portion shows characteristic impedance of a portion (portion floating in air), which is not in contact with the electronic part or the substrate, of the terminal shown in FIGS. 1, 2 and 3, through which the electronic part is connected to the substrate.

Figure 10A:
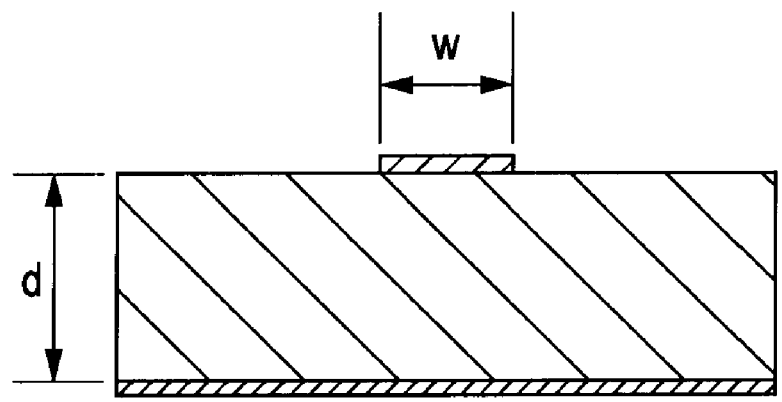
FIGS. 10A and 10B show a microstrip line.
Figure 10B:
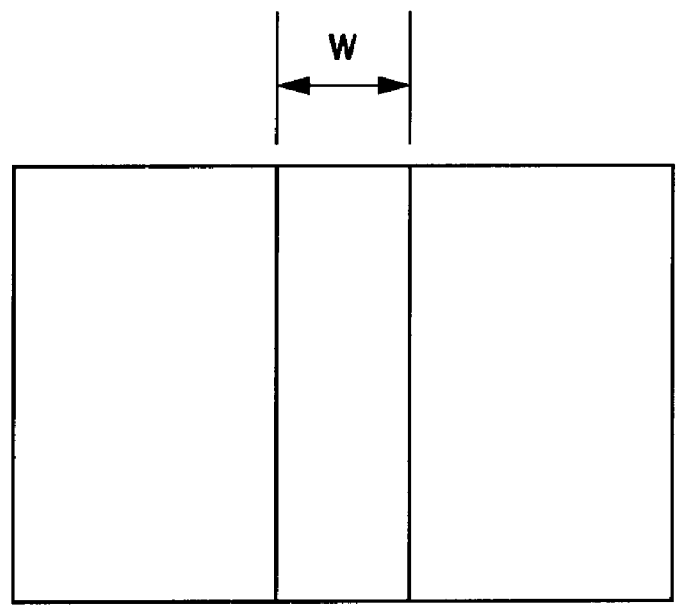

It is in general that, as shown in FIGS. 10A and 10B, if the width (line width) of the conductor material is denoted as W and the dielectric thickness is denoted as d, the characteristic impedance in the microstrip line is determined on the basis of Expressions (1A), (1B), (2A), and (2B) described below.

$$\text{When } \frac{W}{d} < 1.0, \quad (1A)$$

$$Z_0 = \frac{60}{\sqrt{\varepsilon_e}} \cdot \ln\left(\frac{8d}{W} + \frac{W}{4d}\right)$$

$$\varepsilon_e = \frac{\varepsilon_r+1}{2} + \frac{\varepsilon_r-1}{2} \cdot \left( \frac{1}{\sqrt{1+\frac{12d}{W}}} + 0.04\left(1-\frac{W}{d}\right)^2 \right) \quad (1B)$$

When $\frac{W}{d} \geq 1.0$, $$Z_0 = \frac{120\pi}{\sqrt{\varepsilon_e}} \cdot \left( \frac{W}{d} + 1.393 + 0.667 \cdot \ln\left(\frac{W}{d}+1.444\right)^{-1} \right) \quad (2A)$$

$$\varepsilon_e = \frac{\varepsilon_r+1}{2} + \frac{\varepsilon_r-1}{2} \cdot \frac{1}{\sqrt{1+\frac{12d}{W}}} \quad (2B)$$

where $Z_0$ is the characteristic impedance, $\in_e$ is the effective dielectric constant, $\in_r$ is the relative dielectric constant, W is the line width, and d is the dielectric thickness.

The calculation result of the characteristic impedance in a case where a microstrip line structure is adopted is shown in FIG. 11.

In addition, also, regarding typical line shapes shown in FIG. 12, a general expression for determining characteristic impedance on the basis of the electric characteristic value and a cross-sectional shape of a line exists. FIG. 12 shows, as lines forming a connection part between a substrate and an electronic part, a strip line, a microstrip line, a strip line, a coplanar line, and a parallel line.

Figure 8:
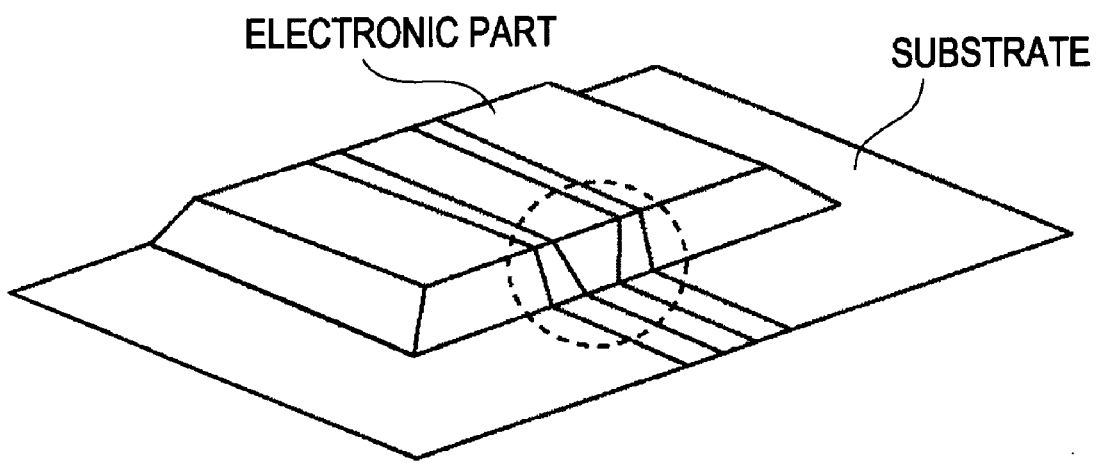
FIG. 8 shows an example of a case in which a coplanar line is used as a line forming a connection part.
Figure 9A:
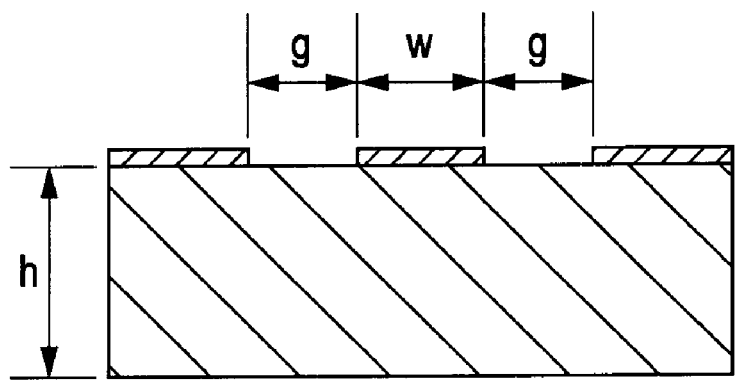
FIGS. 9A and 9B show a dotted-line portion of FIG. 8.
Figure 9B:
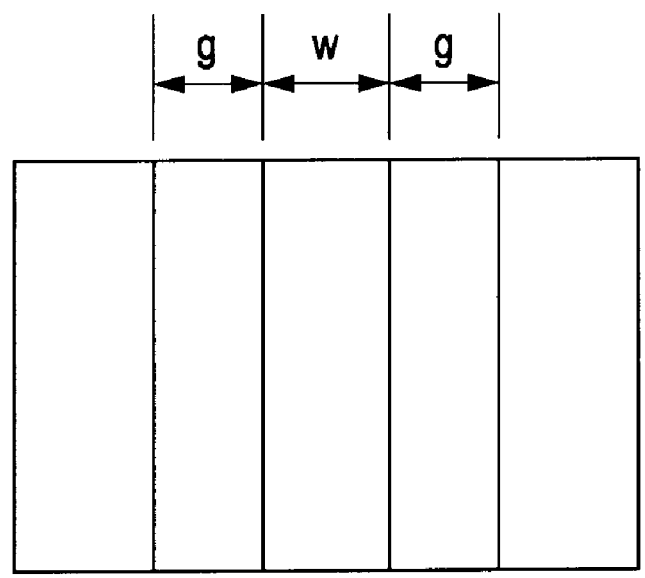

FIG. 8 shows an example of a case in which a coplanar line is used as a line forming a connection part between the substrate 1 and the surface mount part 2. As described above, as a line forming a connection part in this manner, a coplanar line can be used. FIG. 9A is a sectional view showing a portion enclosed using a dotted line in FIG. 8. FIG. 9B is a front view showing the top surface of an electronic part of FIG. 8. In the example of FIG. 8, the closer the line disposed on the slope to the connection part with the substrate, the larger the width of the line.

As the constituent material of the substrate 1, a common substrate material is used. For the conductor part, a metal conductor such as, for example, copper, is used. For the dielectric part, for example, phenol, a glass epoxy resin, alumina, or Teflon (registered trademark) is used.

The above-described connection method can be applied to a case in which the entirety of electronic parts, such as an antenna and an LSI, which are surface mounted on a substrate, is connected onto the substrate. Hereinafter, a connection method in which, in the manner described above, at least a part of the side surface of a dielectric element forming the surface mount part 2 is formed as a slope, and a conductor is wired along the slope, thereby connecting the electronic part to the wiring on the substrate will be referred to simply as the present connection method as appropriate.

With the present connection method, in a case where electronic parts, such as an antenna and a filter circuit, are to be surface mounted onto a substrate that handles a high-speed signal, such as a radio frequency (RF) signal, it becomes possible to reduce reflection due to impedance unmatching in the connection part and to satisfactorily maintain signal quality. The high-speed signal herein refers to a signal having a connection length or a wiring length that exceeds 1/10 of the wavelength of the transmission signal at the maximum frequency.

Modification

As described with reference to FIG. 12, the structure of the connection line can be handled as a distributed constant circuit. The connection line may be a microstrip line, a strip line, a coplanar line, or a parallel line as long as impedance can be adjusted.

The physical shape of the line width of the connection part may be discontinuous as long as impedance is continuously changed in an electrical manner. When the line width of the connection part is to be determined, a rate of change in the impedance at the line length with respect to the wavelength of the transmission frequency becomes a measure.

Figure 13:
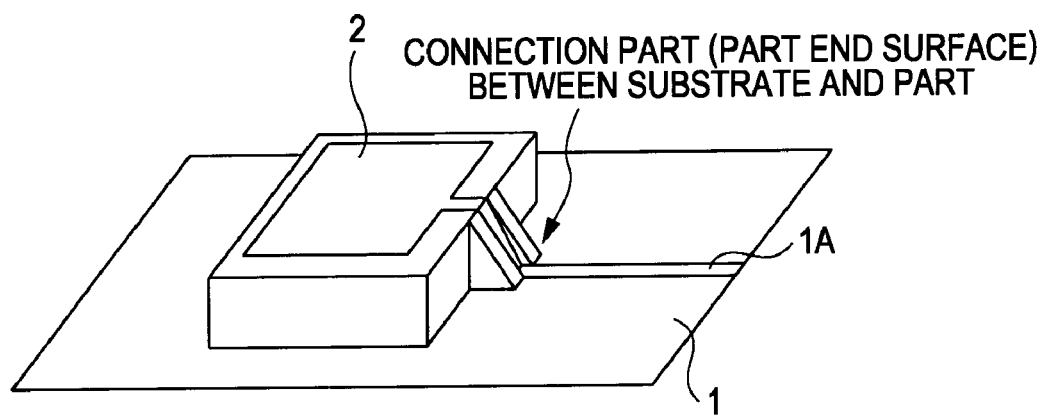
FIG. 13 shows another example of the configuration of the connection part.
Figure 14:
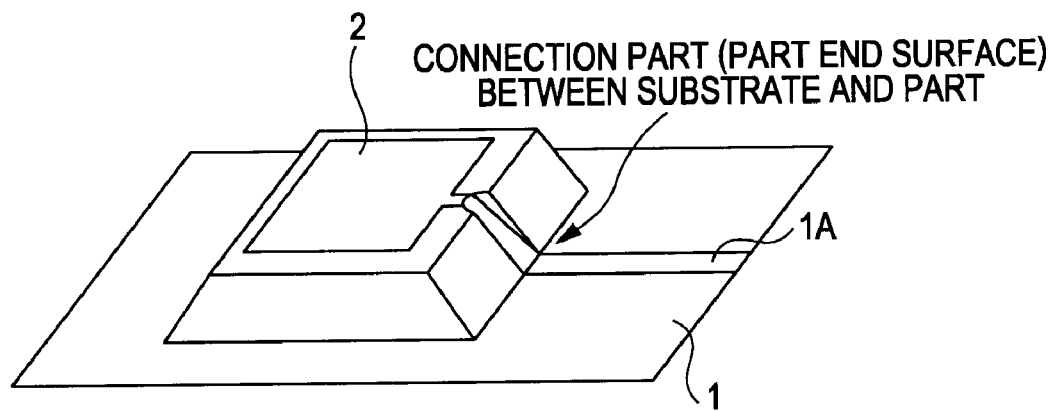
FIG. 14 shows still another example of the configuration of the connection part.
Figure 15A:
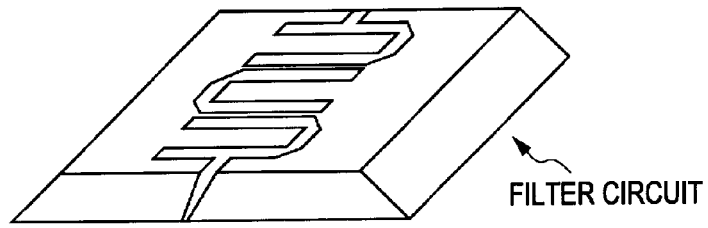
FIGS. 15A, 15B, 15C, and 15D show examples of surface mount parts.
Figure 15B:
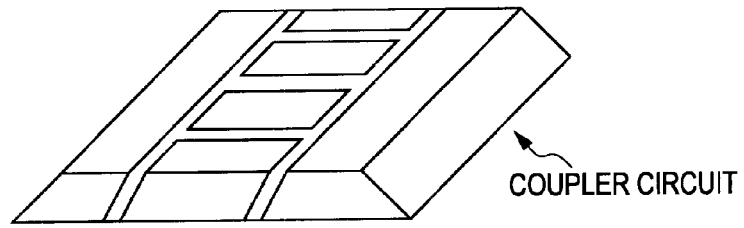
Figure 15C:
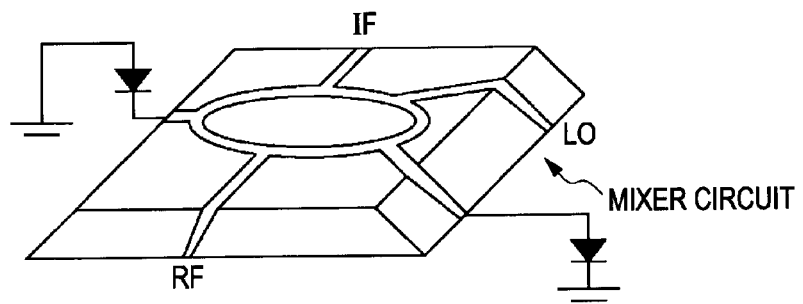
Figure 15D:
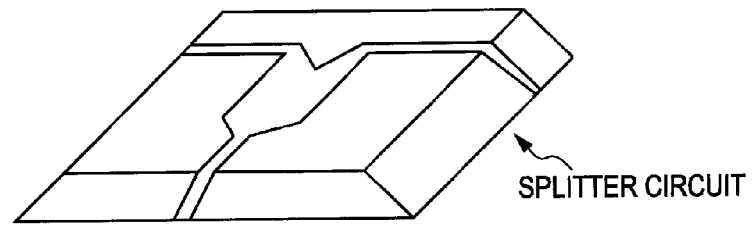

The connection part may be configured in such a manner that, even though the entire dielectric end 2A forming the side surface of the surface mount part 2 as shown in FIG. 4 is not obliquely provided, a part of the side surface thereof may be formed so as to be a slope as shown in FIG. 13, and the line whose width has been adjusted may be wired on the slope. Alternatively, a through hole may be obliquely provided in the end surface as shown in FIG. 14, and a line whose width has been adjusted may be wired in the inner side thereof.

For the surface mount part 2 that can be connected by the present connection method, in addition to an antenna circuit, various parts, such as a filter circuit, a resonance circuit, a mixer circuit, and a splitter circuit, shown in FIGS. 15A to 15D, can be used.

Furthermore, the present connection method can be applied to not only the connection between a printed wiring substrate and a surface mount part, but also to wiring between parts, wiring between substrates, wiring inside parts, wiring of a multilayered substrate, and semiconductor wiring. For example, it is considered that the present connection method is effective for wiring inside a multilayered substrate or parts, or effective for wiring connection inside a semiconductor package.

With the adoption of the present connection method, 1. signal deterioration due to impedance unmatching between wires can be reduced. In particular, the present connection method is effective for a connection between substrates, which handle a high-speed signal, such as in the case of an RF circuit, and parts.

2. the present connection method can be realized using a simple line structure, such as a microstrip line or a coplanar line, and an extra circuit, a connector, and the like are not necessary.

3. the present connection method can be applied to not only surface mount parts, such as a filter and an antenna, but also to overall parts (wiring inside a multilayered substrate, a semiconductor package, or the like) in which an inductive capacity exists between signal lines.

Supplemental Description

In order to supplement the above point 1, a description will be given below of a result in which deterioration in a transmission signal is analyzed by electromagnetic simulation.

Figure 16:
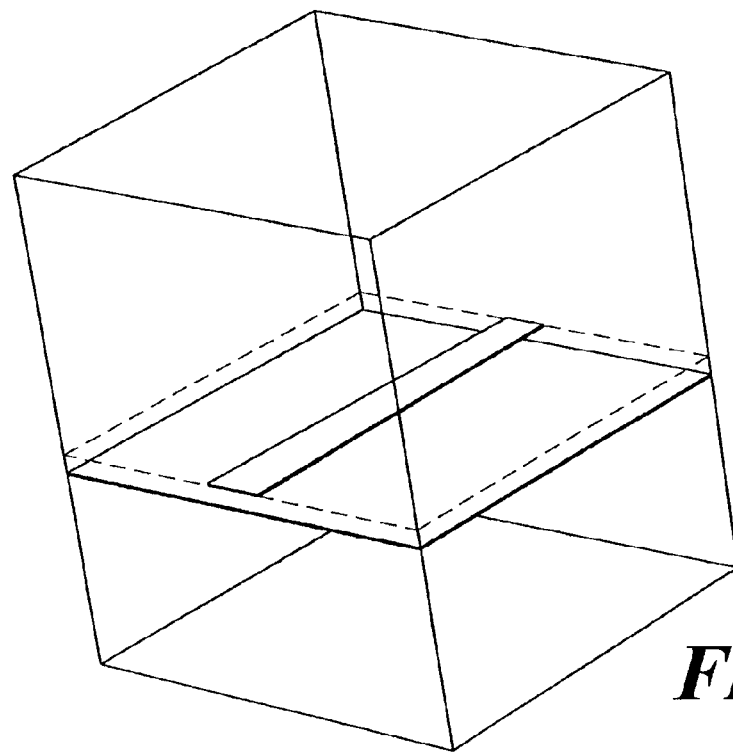
FIG. 16 shows a microstrip line model.
Figure 17A:
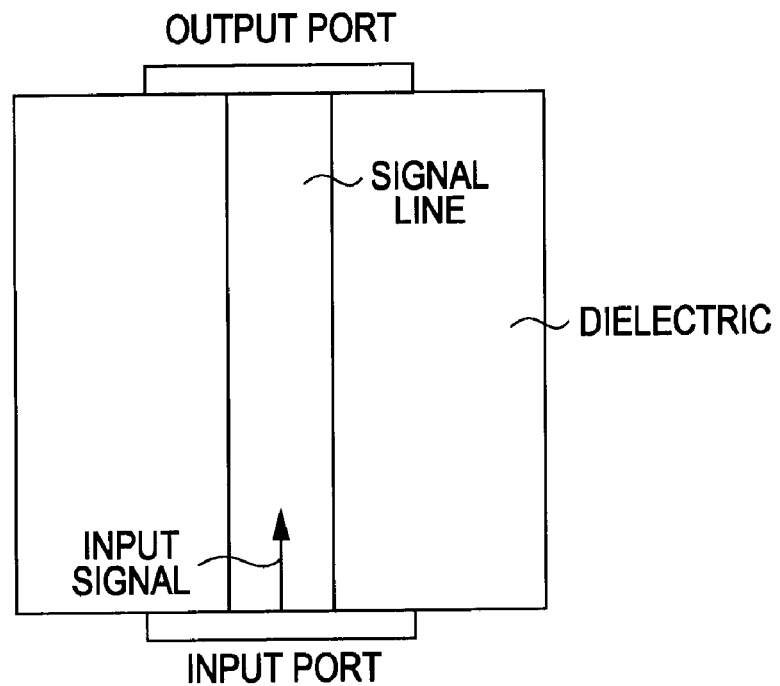
FIG. 17A is a front view of the model of FIG. 16.
Figure 17B:
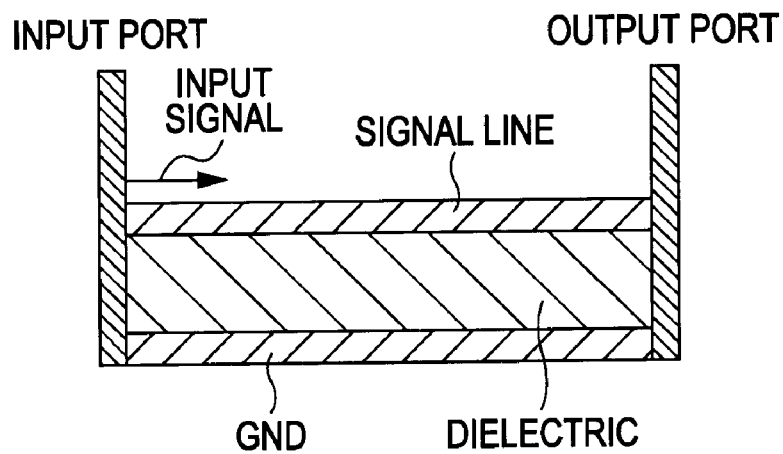
FIG. 17B is a sectional view of the model of FIG. 16.

A simple microstrip line model is shown in FIG. 16 and FIGS. 17A and 17B. FIG. 16 shows a model in a three-dimensional manner. FIG. 17A is a front view of the model of FIG. 16, and FIG. 17B is a sectional view of the model of FIG. 16.

This model is formed by a signal line, a dielectric substrate, and a GND (formed in such a manner that a signal line is disposed on a substrate formed of a GND layer and a dielectric layer). In order to simulate deterioration of a transmission signal, a test signal is input from an input port, and the transmitted signal is observed at an output port. For evaluation, a general value in which an S-parameter is represented in dB (decibel) is generally used. Therefore, here, an S-parameter represented by the following Expression (3) is used as S21.

$$S21 = \log 10(\text{output signal/input signal})[dB] \quad (3)$$

Figure 18:
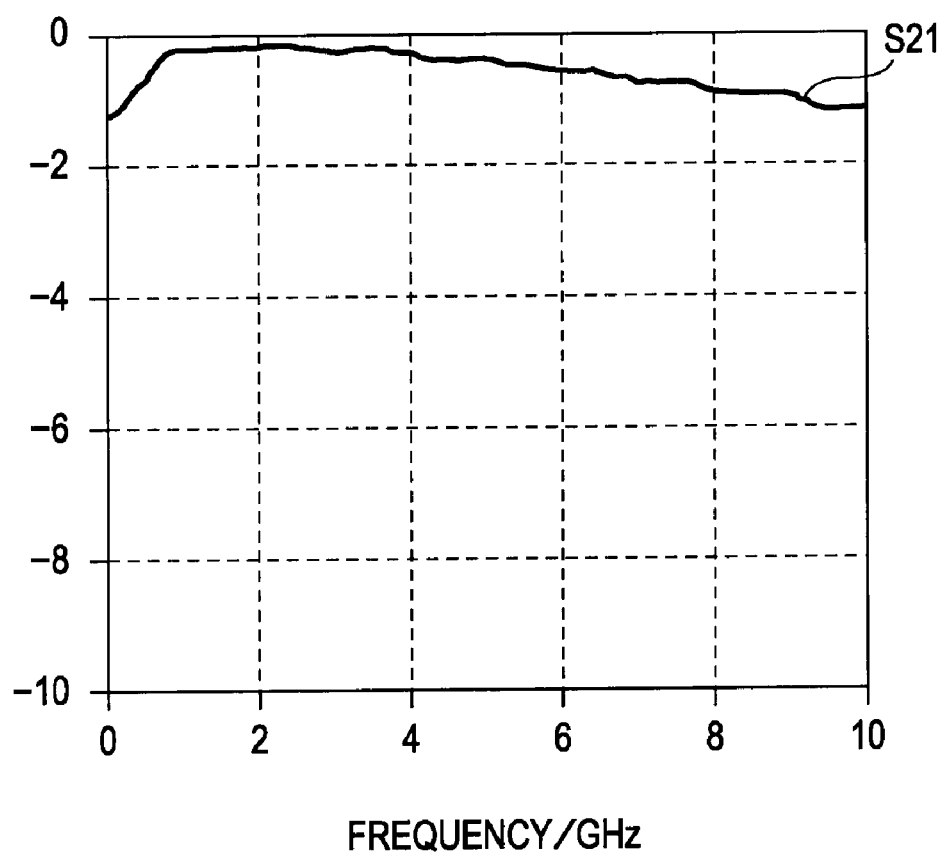
FIG. 18 shows a transmission simulation result.

The transmission simulation result is shown in FIG. 18. The horizontal axis of FIG. 18 shows the frequency [GHz], and the vertical axis shows S21 [dB]. As the frequency increases, S21 is slightly decreased. Since the material of the line model is homogenous and the shape of the cross section thereof is fixed, the deterioration is considered to be mainly caused by induced loss of a signal that is transmitted through the substrate. Therefore, in this model in a state close to an ideal state in which impedance matching has been achieved, transmission deterioration is approximately −1 dB@10 GHz.

Next, a description will be given below of simulation results in which a typical connection method and the present connection method are used.

Figure 19:
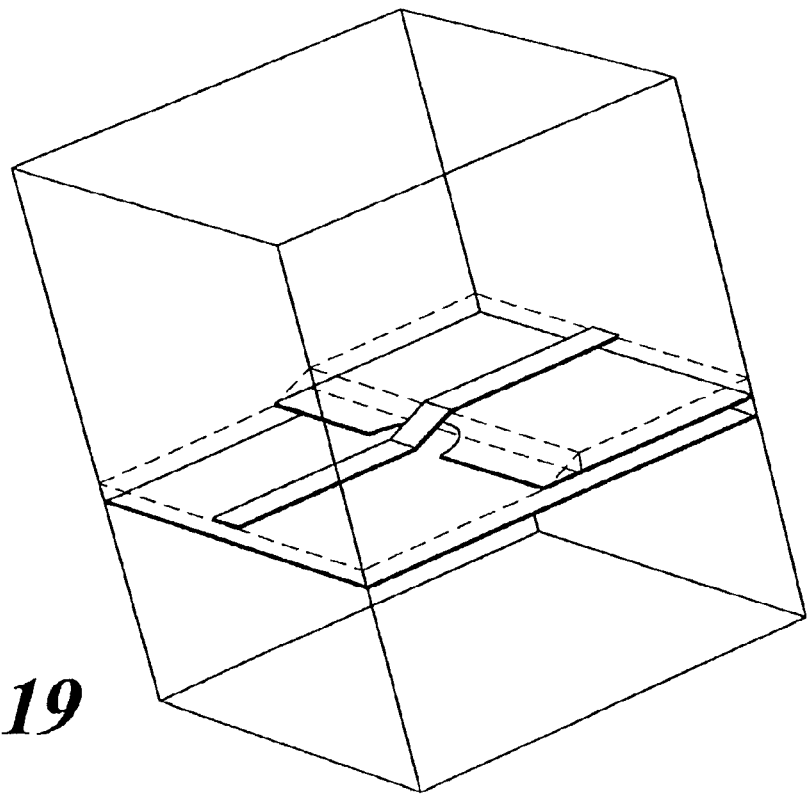
FIG. 19 shows a model in which substrates having different heights are connected by the present connection method.

FIG. 19 shows a model in which substrates having different heights are connected to each other using the present connection method.

Figure 20:
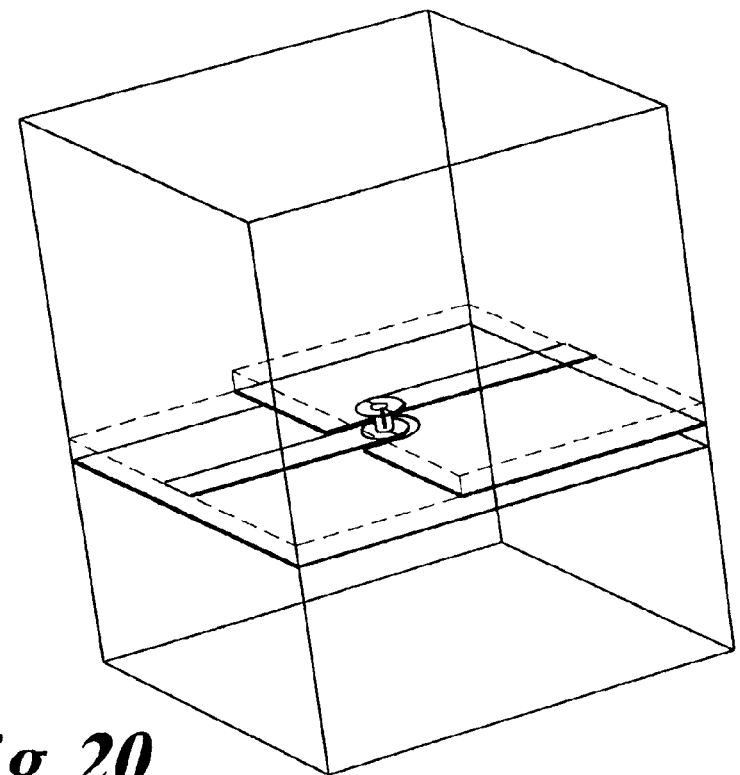
FIG. 20 shows a model in which substrates having different heights are connected using a through hole.
Figure 21:
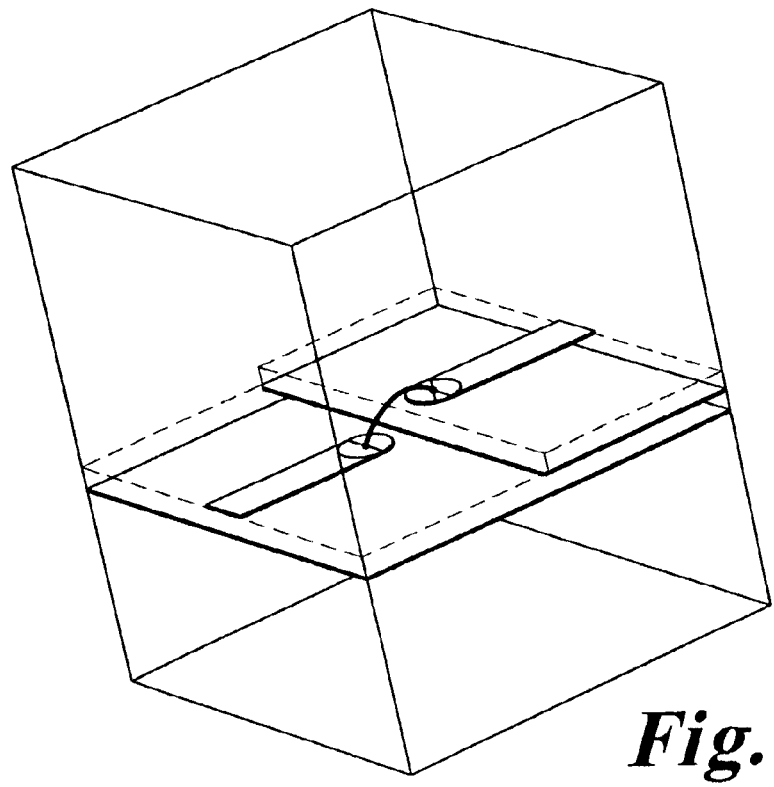
FIG. 21 shows a model in which substrates having different heights are connected using wire bonding.
Figure 22:
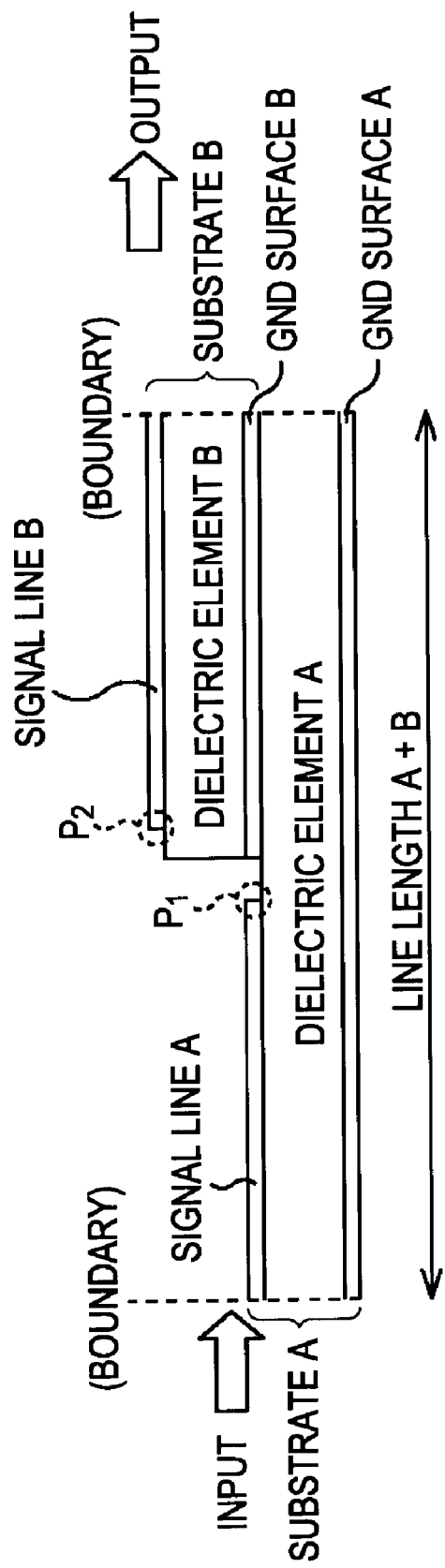
FIG. 22 is a view showing conditions for a model.

FIGS. 20 and 21 each show a model in which substrates having different heights are connected to each other by using a through hole and wire bonding, respectively. FIGS. 22 and 23 show conditions of models shown in FIGS. 19, 20 and 21.

The models shown in FIGS. 19, 20 and 21 are such that the section between a position $P_1$ in a signal line A of a substrate A and a position $P_2$ in a signal line B of a substrate B arranged so as to overlap the substrate A (dielectric element A), which is indicated by being enclosed using a dotted line in FIG. 22, are connected by the present connection method, a through hole, and wire bonding, respectively.

The conditions of the substrate A configured in such a manner that the dielectric element A is laminated on the GND surface A and the signal line A is disposed on the input side on the dielectric element A, and the substrate B configured in such a manner that the dielectric element B is laminated on the GND surface B and the signal line B is disposed on the dielectric element B are shown in FIG. 23.

In the conditions of FIG. 23, the line widths of the signal lines A and B are set to 3.2 mm, the height is set to 0.2 mm, and the total of the line lengths of the signal lines A and B is set to 30 mm. The height of the dielectric elements A and B is set to 1.6 mm, the dielectric constant is set to $7.1 \times 10^{-12}$ [F/m], and the induced loss when a signal of 10 GHz is made to flow is set to 0.005.

Figure 24:
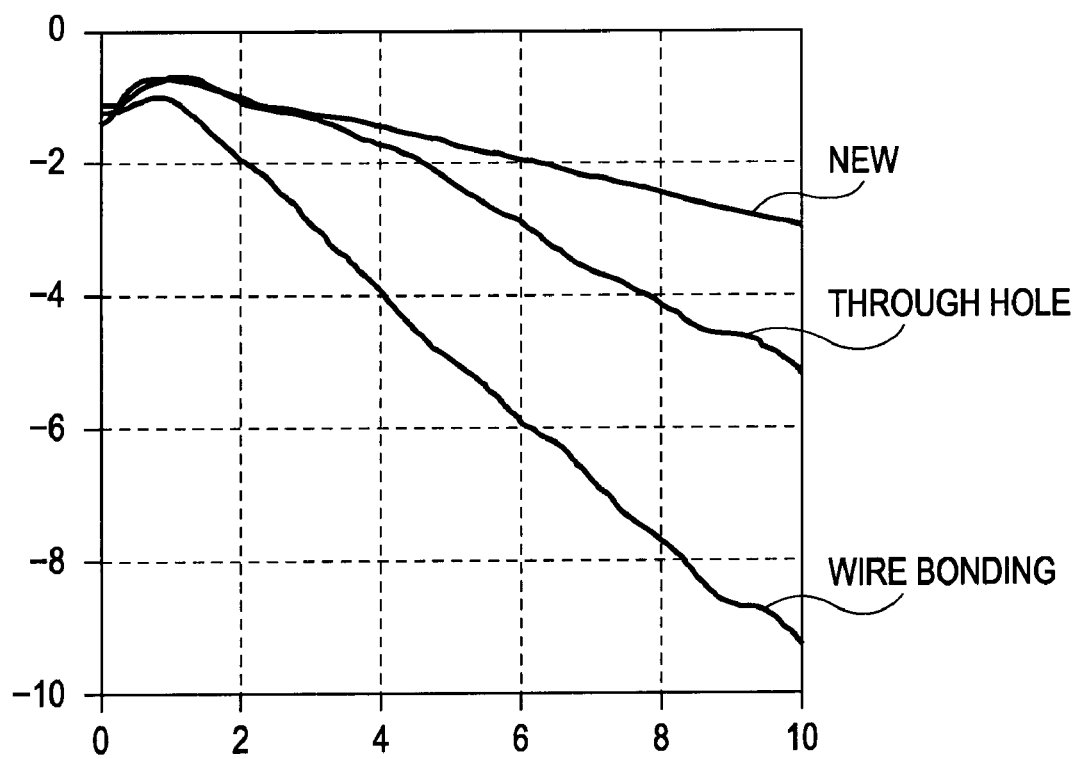
FIG. 24 shows simulation results.

The results of simulation performed by each connection method under the conditions shown in FIG. 23 are shown in FIG. 24. The horizontal axis of FIG. 24 indicates the frequency [GHz], and the vertical axis indicates S21 [dB]. The values of S21 [dB] at each frequency of 3 GHz, 6 GHz, and 10 GHz are shown in FIG. 25.

It can be seen from the results shown in FIGS. 24 and 25 that the deterioration of the transmission signal of the present connection method is the smallest among the three models. Furthermore, the simulation result of the model in which the present connection method is used is closest to the simulation result of the ideal model shown in FIG. 18. It can be seen that, in particular, as the frequency becomes higher, the more apparent the difference in the characteristics between the present connection method and the other methods. It is considered from these results that use of the present connection method is effective for reducing signal deterioration.

Example of Connection Between Line on Electronic Part Side and Line on Substrate Side Next, a description will be given below of the shape of a line on an electronic part side in the vicinity of a connection part with a line on a substrate side.

Figure 26A:
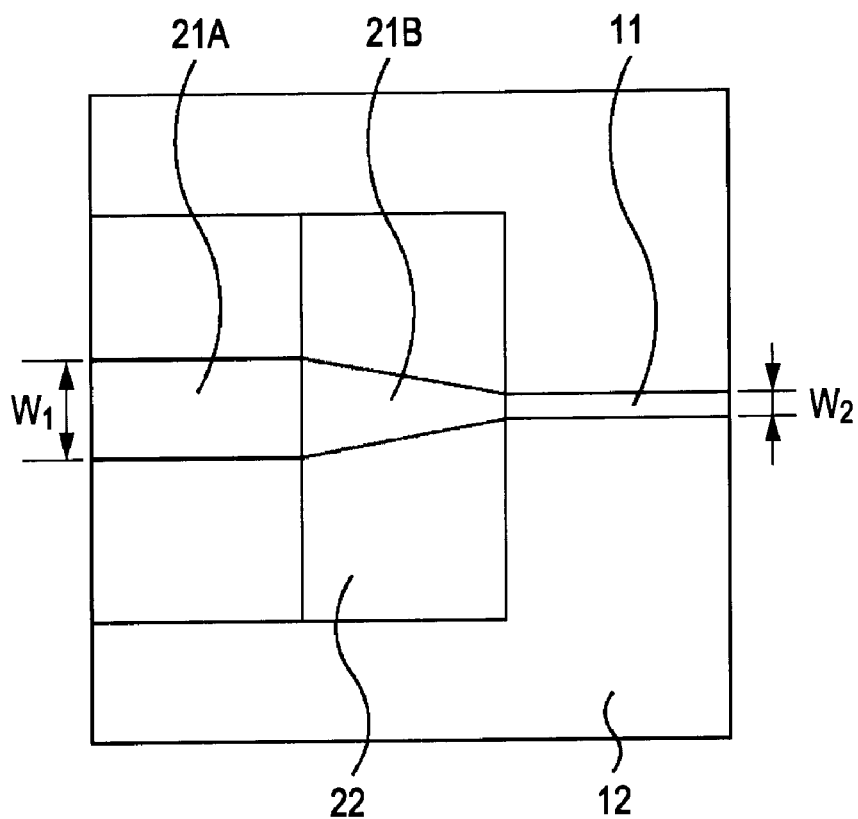
FIGS. 26A and 26B show an example of the shape of a line on an electronic part side.
Figure 26B:
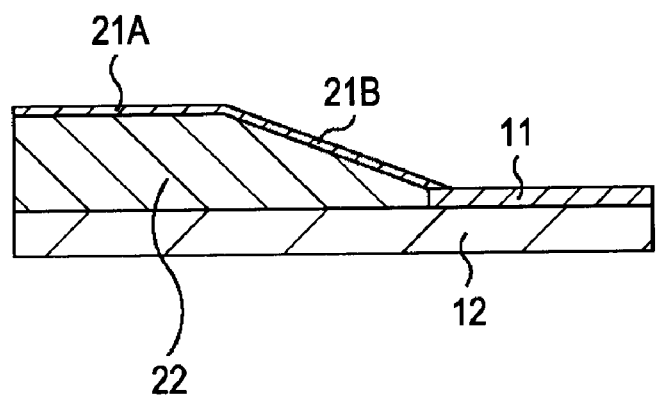

FIG. 26A is a front view showing a first shape. FIG. 26B is a sectional view of the structure shown in FIG. 26A.

The first shape shown in FIGS. 26A and 26B is the same as that described with reference to FIGS. 4 to 6. That is, as shown in FIG. 26B, a slope is formed in the end portion of an electronic part, and a line 21B, which is a part of a line on the electronic part side, is disposed along the slope. The thickness of the dielectric element 22 on the electronic part side at each position of the line 21B decreases linearly as the line approaches the connection part with the line 11 on the substrate side.

The shape when the line 21B is viewed from directly above is, as shown in FIG. 26A, formed so as to be symmetrical about the axis in the length direction of the line 21B, and the width is changed linearly between a width $W_2$ and a width $W_1$ according to the thickness of the dielectric element 22 at each position. The width $W_1$ is the width of the line 21A disposed on the top surface of the dielectric element 22 on the electronic part side, and the width $W_2$ is the width of the line 11A disposed in the dielectric element 12 on the substrate side.

Figure 27A:
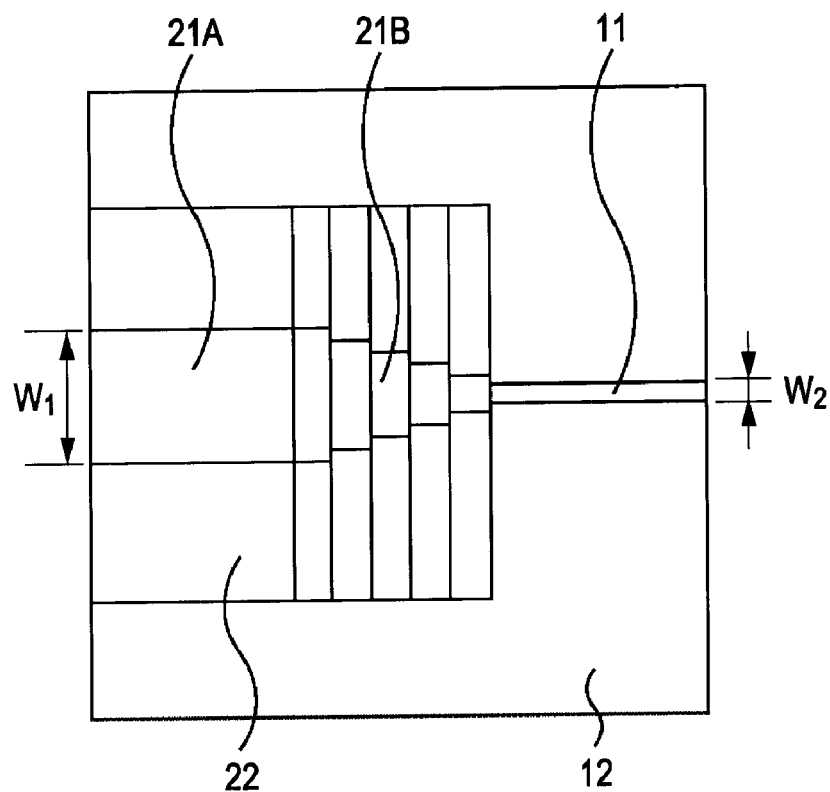
FIGS. 27A and 27B show another example of the shape of the line on the electronic part side.
Figure 27B:
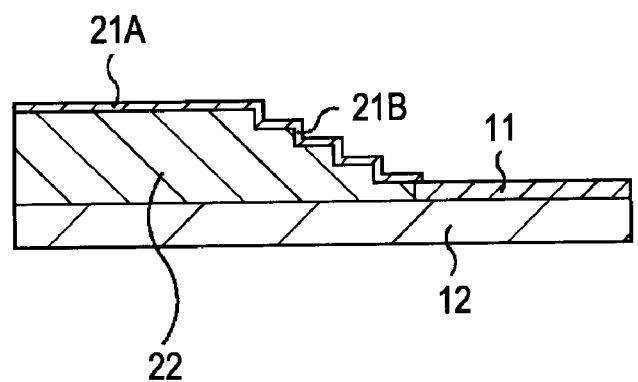

FIG. 27A is a front view showing a second shape. FIG. 27B is a sectional view of the structure shown in FIG. 27A.

In the example of this shape, as shown in FIG. 27B, five steps are formed in the end portion of the electronic part, and the line 21B, which is a part of a line on the electronic part side, is disposed on these steps. The thickness of the dielectric element 22 on the electronic part side at each position of the line 21B decreases in a step-like manner as the line approaches the connection part with the line 11 on the substrate side and as the number of steps from the substrate decreases.

The shape when the line 21B is viewed from directly above is, as shown in FIG. 27A, formed symmetrical about the axis of the line 21B in the length direction, and the width is changed in a step-like manner from the width $W_2$ to the width $W_1$ according to the thickness of the dielectric element 22 at each position.

Figure 28A:
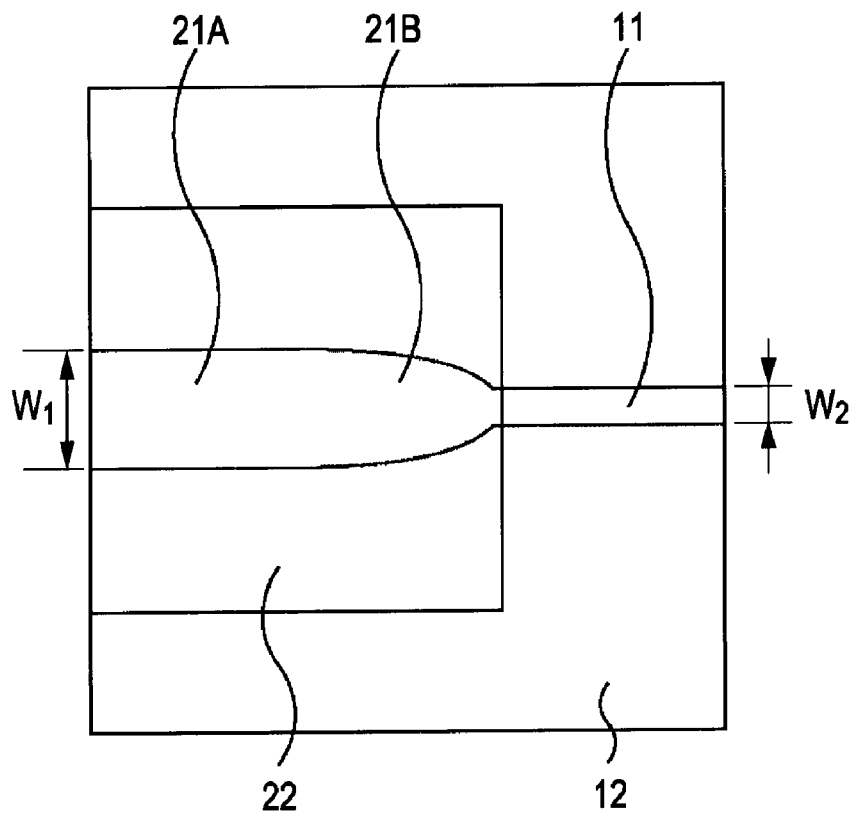
FIGS. 28A and 28B show still another example of the shape of the line on the electronic part side.
Figure 28B:
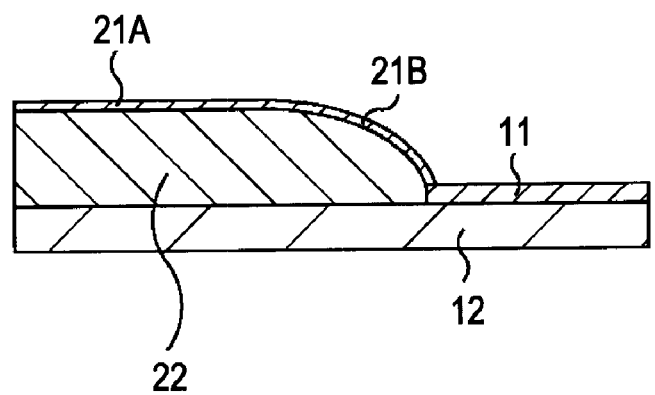

FIG. 28A is a front view showing a third shape. FIG. 28B is a sectional view of the structure shown in FIG. 28A.

In the example of this shape, as shown in FIG. 28B, a curved surface whose cross section is formed nearly in a fan shape is formed in the end portion of the electronic part. The line 21B, which is a part of the line on the electronic part side, is disposed along this curved surface. The thickness of the dielectric element 22 on the electronic part side at each position of the line 21B decreases as the line approaches the connection part with the line 11 on the substrate side.

The shape when the line 21B is viewed from directly above is, as shown in FIG. 28A, formed in a shape symmetrical about the axis of the line 21B in the length direction, and the width is changed at a predetermined ratio between a width $W_2$ and a width $W_1$.

Figure 29A:
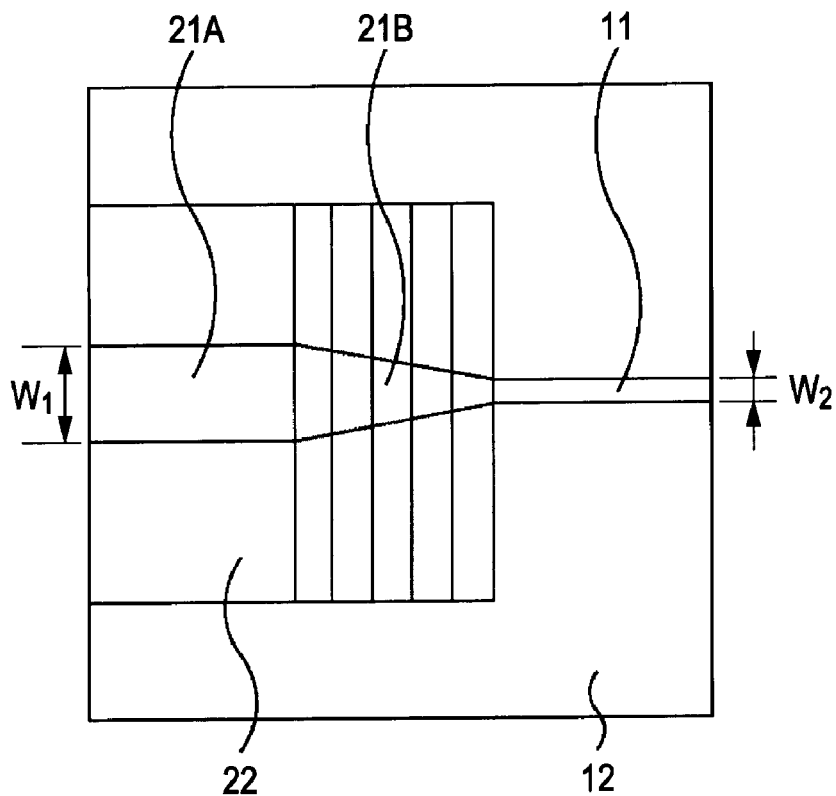
FIGS. 29A and 29B show an example of the shape of the line on the electronic part side.
Figure 29B:
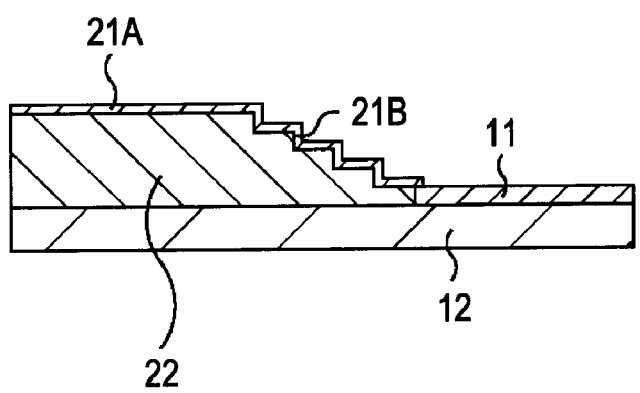

FIG. 29A is a front view showing a fourth shape. FIG. 29B is a sectional view of the structure shown in FIG. 29A.

The shape shown in FIG. 29A is the same as the shape described with reference to FIG. 26A. The line 21B is formed in a shape symmetrical about the axis of the line 21B in the length direction, and the width is changed linearly between a width $W_2$ and a width $W_1$ according to the thickness of the dielectric element 22 at each position.

The shape shown in FIG. 29B is the same as the shape described with reference to FIG. 27B. Five steps are formed in the end portion of an electronic part, and the line 21B, which is a part of the line on the electronic part side, is disposed on these steps. The thickness of the dielectric element 22 on the electronic part side at each position of the line 21B decreases in a step-like manner as the line approaches the connection part with the line 11 on the substrate side and as the number of steps from the substrate decreases.

Figure 30A:
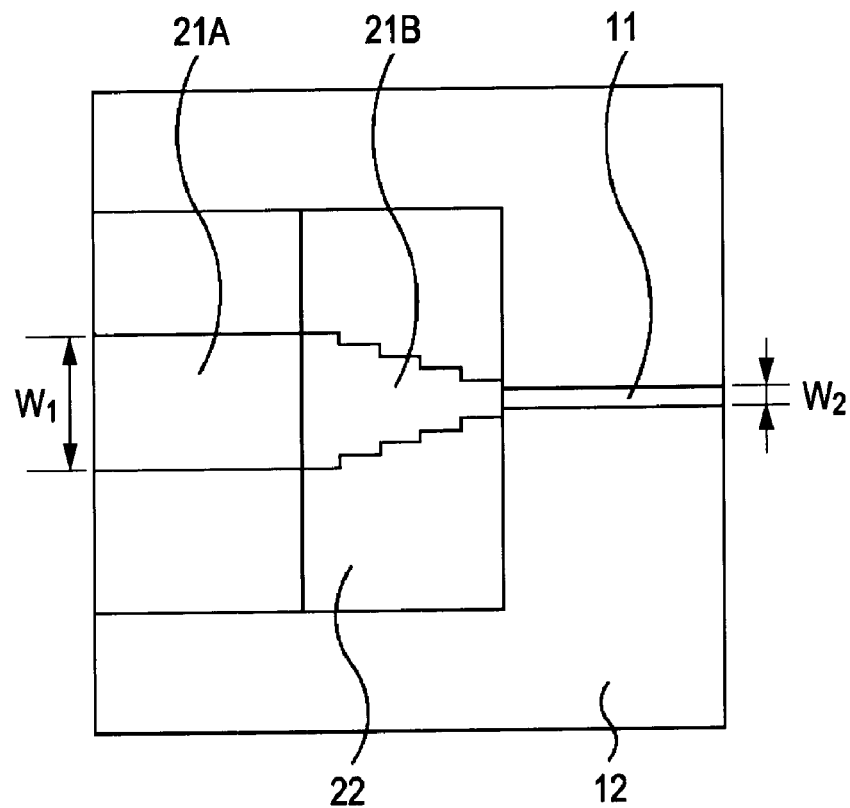
FIGS. 30A and 30B show another example of the shape of the line on the electronic part side.
Figure 30B:
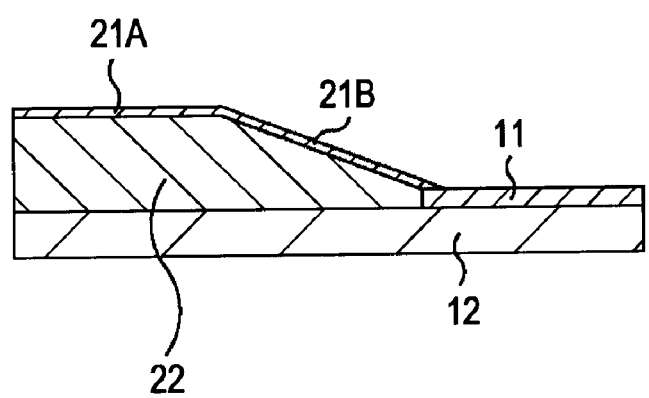

FIG. 30A is a front view showing a fifth shape. FIG. 30B is a sectional view of the structure shown in FIG. 30A.

The shape shown in FIG. 30A is the same as the shape described with reference to FIG. 27A. The line 21B is formed in a shape symmetrical about the axis of the line 21B in the length direction, and the width thereof is changed in a step-like manner between a width $W_2$ and a width $W_1$ according to the thickness of the dielectric element 22 at each position.

The shape shown in FIG. 30B is the same as the shape described with reference to FIG. 26B. A slope is formed in the end portion of the electronic part, and the line 21B, which is a part of the line on the electronic part side, is disposed along the slope. The thickness of the dielectric element 22 on the electronic part side at each position of the line 21B decreases linearly as the line approaches the connection part with the line 11 on the substrate side.

Application Example

In the foregoing, a case in which the number of dielectric layers of the electronic part is one has been described. Even in a case where the dielectric layer is multilayered, in a similar manner, it is possible to connect a line on the electronic part to a line on the substrate.

Figure 31:
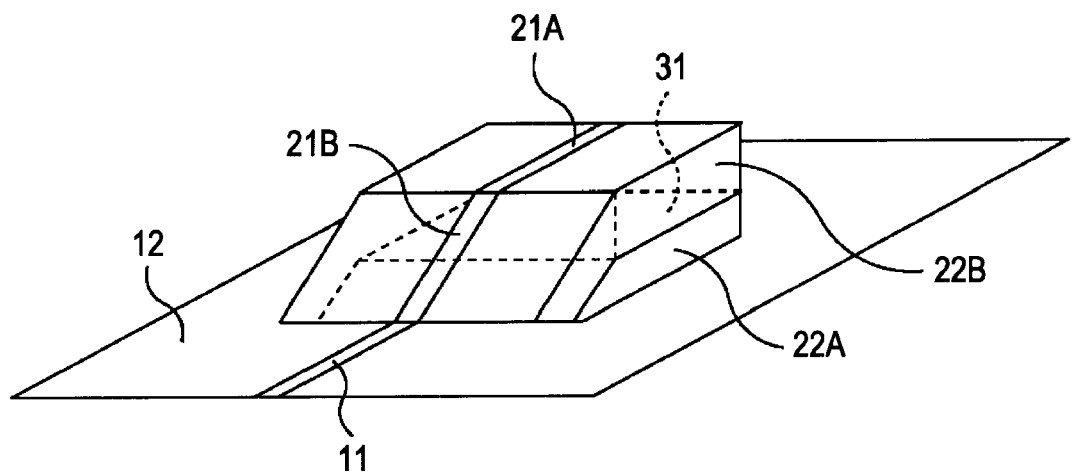
FIG. 31 is a perspective view showing an example of connection in a case where the number of dielectric layers of an electronic part is two.

FIG. 31 is a perspective view showing an example of connection in a case where the number of dielectric layers of the electronic part is two. The same components as those shown in FIG. 26 are designated with the same reference numerals.

In the example of FIG. 31, as dielectric layers forming an electronic part, dielectric elements 22A and 22B are used in a stacked manner. A line 21A is disposed on the top surface of a dielectric element 22B, which is an upper layer, and a line 21B is disposed in the slope. A GND surface 31 is sandwiched between the dielectric elements 22A and 22B.

In the example of FIG. 31, the width of the line 21B disposed in the slope of the dielectric element 22B is set to a fixed width. By providing the GND surface 31 and by adjusting the thickness of the dielectric element 22B in the slope on which the line 21B is disposed, it is possible to set the width of the line 21B to be fixed in the manner described above.

Figure 32:
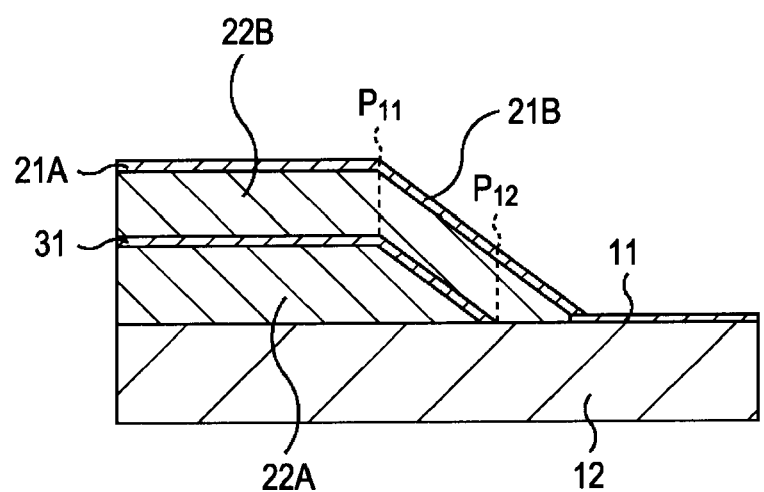
FIG. 32 is a sectional view of the structure shown in FIG. 31.

FIG. 32 is a sectional view of the structure shown in FIG. 31.

As shown in FIG. 32, the slope of the dielectric element 22A has an angle that is the same as the slope of the dielectric element 22B with respect to the substrate surface. The thickness of the dielectric element 22B at each position of the line 21B is adjusted using the GND surface 31 so that the thickness becomes fixed from the position $P_{11}$ that is directly above the boundary between the top surface and the slope of the dielectric element 22A up to the position $P_{12}$ that is directly above the boundary between the top surface and the slope of the dielectric element 22A. The thickness of the dielectric layer gradually decreases from the position $P_{12}$ toward the connection part with the substrate.

As described above, it is also possible to set the number of dielectric layers on which a line is disposed to be plural. Furthermore, the present connection method can be applied to various cases in which two points having different heights are connected, for example, not only a case in which a line on an electronic part is connected to a line on a substrate on which the electronic part is mounted, but also a case in which a line on a substrate is connected to a line on another substrate.

Figure 33:
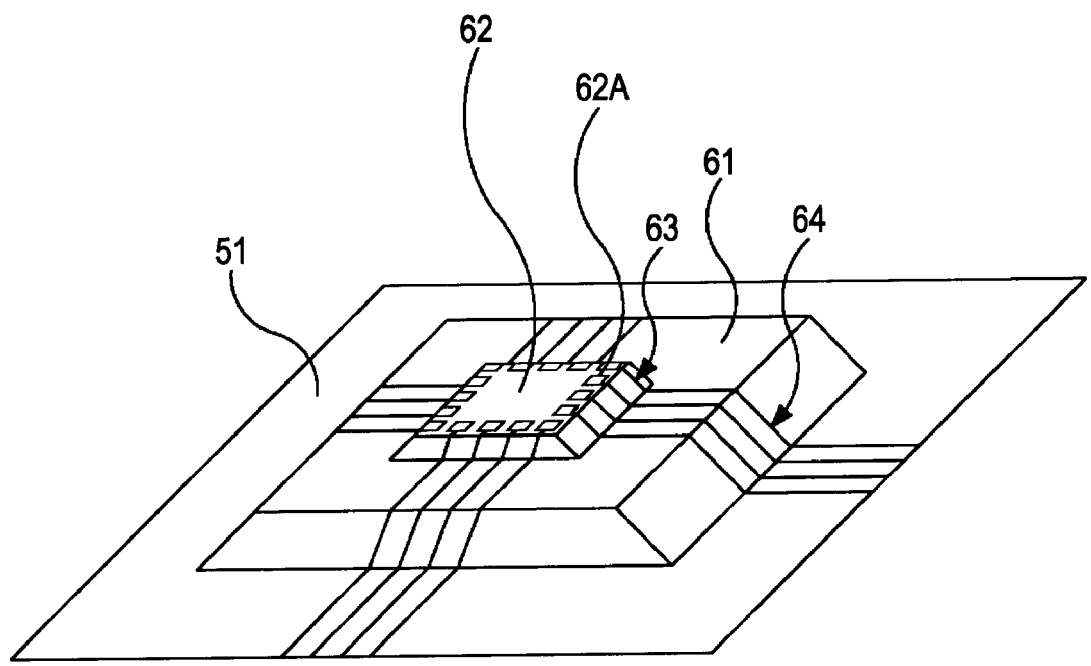
FIG. 33 is a perspective view showing an example of a case in which the present connection method is used for connection of a semiconductor package.

FIG. 33 is a perspective view showing an example of a case in which the present connection method is used for the connection of a semiconductor package.

In the example of FIG. 33, a semiconductor package 61 is mounted on a substrate 51, and a chip part 62, such as an LSI (Large Scale Integration) IC, is mounted thereon. Both the semiconductor package 61 and the chip part 62 have a shape in which the cross section thereof in the vertical direction is formed in the shape of a trapezoid. A plurality of electrodes 62A are provided on the top surface of the chip part 62 in such a manner as to be exposed.

Wiring employing the present connection method can be applied to wiring 63 between a line disposed on the top surface of the chip part 62 from the electrode 62A and a line on the top surface of the semiconductor package 61 and to wiring 64 between a line on the top surface of the semiconductor package 61 and a line on the substrate.

The present application contains subject matter related to those disclosed in Japanese Priority Patent Application JP 2008-156048 filed in the Japan Patent Office on Jun. 13, 2008 and Japanese Priority Patent Application JP 2008-214553 filed in the Japan Patent Office on Aug. 22, 2008, the entire content of which are hereby incorporated by reference.

It should be understood by those skilled in the art that various modifications, combinations, sub-combinations and alterations may occur depending on design requirements and other factors insofar as they are within the scope of the appended claims or the equivalents hereof.

What is claimed is:

1. A substrate, comprising:
    a dielectric element mounted on the substrate, the dielectric element including steps;
    an electric part mounted on the substrate;
    a first line through which a signal flows connecting two points on the dielectric element, the two points having different heights and a width of the first line at positions of the two points being based on a thickness of the dielectric element, a higher point of the two points being a point on a second line of the electronic part mounted on the substrate, a lower point of the two points is a point on a third line of the substrate, the two points having different heights are connected by the first line disposed on the steps, and the width of the first line is constant on each of the steps.

2. The substrate according to claim 1, wherein the dielectric element includes five steps.

3. The substrate according to claim 1, wherein the width of the first line on a bottom step is wider than a width of the third line.

4. A connection method comprising:
    connecting, using a first line on a dielectric element, two points through which a signal flows, the two points having different heights and the widths of the first line at the positions of the two points based on a thickness of the dielectric element, a higher point of the two points being a point on a second line of an electronic part mounted on a substrate, a lower point of the two points being a point on a third line of the substrate, and steps at which the thickness of the dielectric element decreases toward a connection part with the first line of the substrate are formed in the end portion of the electronic part composed of a dielectric material, the two points having different heights are connected by the first line disposed on the steps, and the width of the first line is constant on each of the steps.

5. The method according to claim 4, wherein the dielectric element includes five steps.

6. The method according to claim 4, wherein the width of the first line on a bottom step is wider than a width of the third line.

* * * * *